United States Patent
Spearing et al.

(10) Patent No.: US 7,602,609 B2
(45) Date of Patent: Oct. 13, 2009

(54) COOLING SYSTEM AND METHOD OF USE

(75) Inventors: Ian Spearing, Westerville, OH (US); Timothy J. Schrader, Irwin, OH (US)

(73) Assignee: Liebert Corporation, Columbus, OH (US)

( * ) Notice: Subject to any disclaimer, the term of this patent is extended or adjusted under 35 U.S.C. 154(b) by 0 days.

(21) Appl. No.: 11/756,060

(22) Filed: May 31, 2007

(65) Prior Publication Data

US 2008/0298019 A1    Dec. 4, 2008

(51) Int. Cl.
*H05K 7/20* (2006.01)
*H01L 23/36* (2006.01)

(52) U.S. Cl. .................. 361/701; 361/699; 361/679.53; 165/80.4; 165/104.33; 700/300; 62/259.2

(58) Field of Classification Search ................ 361/687, 361/690, 689, 699, 700, 701, 715–722, 724–727; 62/118, 119, 132, 171, 259.2; 165/80.4, 165/80.5, 104.19–28, 104.33, 200, 208, 209, 165/157–168, 185; 235/492; 340/572.8; 236/46 R; 174/15.1, 15.3, 16.3, 252; 257/714
See application file for complete search history.

(56) References Cited

U.S. PATENT DOCUMENTS

| | | | |
|---|---|---|---|
| 4,846,701 A | | 7/1989 | Hayes et al. |
| 4,847,602 A | * | 7/1989 | Altland et al. ......... 361/679.21 |
| 4,865,123 A | * | 9/1989 | Kawashima et al. ... 165/104.33 |
| 5,131,859 A | * | 7/1992 | Bowen et al. ............... 439/194 |
| 6,029,472 A | | 2/2000 | Galbreath, Sr. |
| 6,161,612 A | * | 12/2000 | St.ang.hl et al. ............ 165/80.4 |
| 6,457,228 B1 | * | 10/2002 | Arai et al. .................. 29/592.1 |
| 6,616,469 B2 | * | 9/2003 | Goodwin et al. ............ 439/196 |
| 6,622,925 B2 | * | 9/2003 | Carner et al. ............. 236/46 R |
| 6,649,829 B2 | | 11/2003 | Garber et al. |
| 6,688,650 B2 | * | 2/2004 | Novotny ....................... 285/13 |
| 6,714,412 B1 | | 3/2004 | Chu et al. |
| 6,807,056 B2 | * | 10/2004 | Kondo et al. ................ 361/689 |
| 6,880,587 B1 | | 4/2005 | Carter et al. |
| 6,889,509 B1 | * | 5/2005 | Cader et al. .................... 62/118 |
| 6,897,374 B2 | * | 5/2005 | Garber et al. .................. 174/47 |
| 6,973,801 B1 | * | 12/2005 | Campbell et al. .......... 62/259.2 |
| 7,017,358 B2 | | 3/2006 | Wayburn et al. |
| 7,050,299 B2 | * | 5/2006 | Kondo et al. ................. 361/689 |
| 7,088,585 B2 | * | 8/2006 | Chu et al. .................... 361/699 |
| 7,106,590 B2 | * | 9/2006 | Chu et al. .................... 361/701 |
| 7,355,852 B2 | * | 4/2008 | Pfahnl ........................ 361/699 |

(Continued)

OTHER PUBLICATIONS

Petio Batev, International Search Report for International Patent Application No. PCT/US2007/088013, European Patent Office, Germany.

(Continued)

*Primary Examiner*—Michael V Datskovskiy
(74) *Attorney, Agent, or Firm*—Locke Lord Bissell & Liddell LLP

(57) ABSTRACT

A system of cooling and method of use that includes a connector having a data reader capable of reading a wireless identifier and/or a breaker box capable of routing liquid cooling to at least one server. In a preferred embodiment, both the quick connector and the breaker box are used in conjunction with a liquid coolant such as refrigerant or water.

11 Claims, 6 Drawing Sheets

U.S. PATENT DOCUMENTS

| | | | |
|---|---|---|---|
| 7,380,409 B2 * | 6/2008 | Campbell et al. | 62/259.2 |
| 7,447,026 B2 * | 11/2008 | Murakami et al. | 361/696 |
| 7,447,920 B2 * | 11/2008 | Sharma et al. | 713/300 |
| 7,484,530 B2 * | 2/2009 | Harvey et al. | 137/614.03 |
| 2004/0221604 A1 | 11/2004 | Ota et al. | |
| 2005/0247070 A1 | 11/2005 | Arshansky et al. | |
| 2005/0247371 A1 | 11/2005 | Chadbourne et al. | |
| 2006/0076419 A1 | 4/2006 | Johnson | |
| 2006/0161311 A1 * | 7/2006 | Vinson et al. | 700/300 |
| 2006/0250755 A1 | 11/2006 | Tilton et al. | |
| 2007/0048475 A1 * | 3/2007 | Haines | 428/36.91 |
| 2007/0083861 A1 * | 4/2007 | Becker et al. | 717/174 |
| 2007/0209716 A1 * | 9/2007 | Rankin | 137/554 |
| 2007/0213881 A1 * | 9/2007 | Belady et al. | 700/300 |

OTHER PUBLICATIONS

Petio Batev, Written Opinion for International Patent Application No. PCT/US2007/088013, European Patent Office, Germany.

* cited by examiner

COOLING SYSTEM AND METHOD OF USE

CROSS REFERENCE TO RELATED APPLICATIONS

Not applicable.

STATEMENT REGARDING FEDERALLY SPONSORED RESEARCH OR DEVELOPMENT

Not applicable.

REFERENCE TO APPENDIX

Not applicable.

BACKGROUND OF THE INVENTION

1. Field of the Invention

This disclosure relates generally to cooling systems, and more particularly to use of liquid coolants with respect to electronic components.

2. Description of the Related Art

Previous systems have refrained from using pumped coolant systems at the server, on-board, or chip level because of the concerns of providing liquid cooling system in proximity with the electronic components of computer systems. The current air cooling systems are inadequate to meet the higher cooling demands of densely stacked electronic racks found in densely populated electronic rack enclosures.

Existing connectors have relied upon pressurized metal pipes and corrugated hose with standard, no-spill quick connects. These pipes are not flexible, and this lack of flexibility has limited plumbing options. Additionally, these corrugated hoses are expensive and rigid in design. The quick connects are bulky for their rated flow rate and have a pressure drop that is detrimental to capacity and temperature performance. These limitations have forced users to be relegated to using circulated water as the cooling medium, as the water systems have been able to accommodate simpler connections and plumbing lines.

Therefore, a need exists for a connector that overcomes the limitations normally encountered in circulating coolant in a flexibly configured plumbing system by addressing each of the performance bottlenecks or limitations of existing designs. A need also exists to provide a method of pumping coolant at the server, on-board, or chip level via a simple connection means.

Moreover, the routing of coolants including refrigerant and water has been costly and complicated in the prior art. These systems have not offered the flexibility of channeling coolant flow to a plurality of servers. Therefore, a need exists to provide a method of pumping coolants in a more efficient manner that allows for greater flexibility and simplicity to be incorporated into a scaled cooling system.

BRIEF SUMMARY OF THE INVENTION

The present invention includes a coordinated system to allow quick coolant connections at the electronic device in a very simple, user-friendly manner and offer the use of a breaker box system to provide liquid coolant to at least one server. It removes the major barriers to using two-phase coolant as the cooling medium.

The present invention relates to a system for cooling at least one electronic device with a liquid coolant, wherein each electronic device has a wireless identifier, the system comprising: a pumper module; a breaker box; a supply line connected to the pumper module and the breaker box system; a return line connected to the pumper module and the breaker box system; a quick connector; a data reader capable of reading the wireless identifier; a connector line connected to the breaker box system and the quick connector; and/or a software monitoring and control system. The system may also include a filtration/purification system in connection with the pumper module and the breaker box, a connection interlock; and an interlock engager/disengager. The quick connector may further comprise status lights, and/or a pneumatic interlock, wherein the connector line comprises metallic layers and polymer layers. Those skilled in the art recognize that RFID is a preferred embodiment and an active transmitter with communications from the server, or could be other passive ID, such as barcode or matrix bar code, or similar identification. The liquid coolant is preferably a refrigerant. The breaker box may further comprise a pump and a reservoir.

A quick connector for use in a system for cooling at least one electronic device having a wireless identifier with a liquid coolant, the quick connector comprising: a data reader capable of reading the wireless identifier of the server; a connection interlock; and an interlock engager/disengager. The quick connector may further comprise status lights, a connector supply line; a connector return line; wherein the pneumatic interlock is capable of restricting connection or disconnection; and/or an interlock confirm. The liquid coolant is preferably a refrigerant.

A breaker box for use in cooling at least one electronic device with a liquid coolant, the breaker box comprising: at least one pump; at least one reservoir; a supply line connected to the breaker box system; a return line connected to the breaker box system; a water line; and a heat exchanger in thermal communication with the water line, the supply line, and the return line. In a preferred embodiment, each pump, each reservoir, and the heat exchanger are located within the breaker box and/or the liquid coolant is water.

A method of cooling at least one electronic device, wherein the electronic device has a receptacle, an electronic device supply line receiver, and an electronic device return line receiver, and wherein the receptacle has a wireless identifier, which comprises the steps of: (a) connecting a quick connector to the receptacle, wherein the quick connector comprises a data reader capable of reading the wireless identifier, a supply line, and a return line; (b) reading data from the wireless identifier; (c) connecting the supply line to the electronic device supply line receiver; and (d) connecting the return line to the electronic device return line receiver. The method may also include feeding refrigerant through at least one line.

A method of cooling at least one electronic device using a liquid coolant, which comprises the steps of: (a) routing a supply line, a return line, and a water coolant line into a breaker box; (b) connecting the liquid coolant line to the server; (c) pumping water to and from the electronic device in the water coolant line with a pump; and (d) exchanging heat from the liquid coolant line to the return line using a heat exchanger. The method may also include maintaining a supply of liquid in a reservoir. In a preferred embodiment, the pump, the reservoir, and the heat exchanger are located within the breaker box, the liquid coolant is water, and/or the method uses the quick connector.

Figure 1:
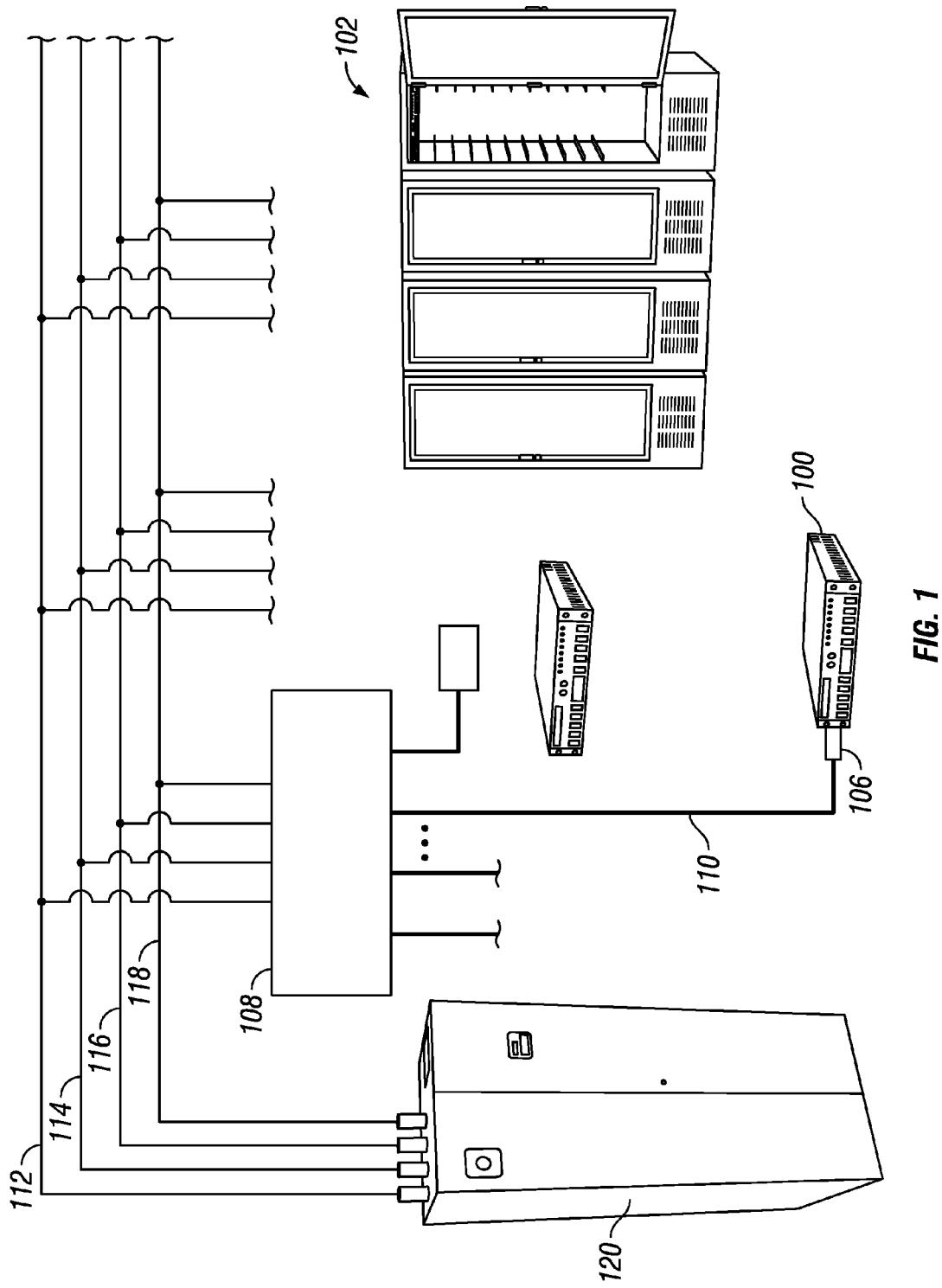
FIG. 1 is a diagram of an embodiment of the overall system.

While the inventions disclosed herein are susceptible to various modifications and alternative forms, only a few specific embodiments have been shown by way of example in the drawings and are described in detail below. The figures and detailed descriptions of these specific embodiments are not intended to limit the breadth or scope of the inventive concepts or the appended claims in any manner. Rather, the figures and detailed written descriptions are provided to illustrate the inventive concepts to a person of ordinary skill in the art and to enable such person to make and use the inventive concepts.

DETAILED DESCRIPTION

One or more illustrative embodiments incorporating the invention disclosed herein are presented below. Not all features of an actual implementation are described or shown in this application for the sake of clarity. It is understood that in the development of an actual embodiment incorporating the present invention, numerous implementation-specific decisions must be made to achieve the developer's goals, such as compliance with system-related, business-related, government-related and other constraints, which vary by implementation and from time to time. While a developer's efforts might be complex and time-consuming, such efforts would be, nevertheless, a routine undertaking for those of ordinary skill in the art having benefit of this disclosure.

The system described herein preferably includes a pumped coolant module, a filtration/purification system, dry nitrogen or similar compressed gas, a vacuum system, a breaker box system, a quick connector system, flexible coolant lines, and a software monitoring and control system.

Figure 8:
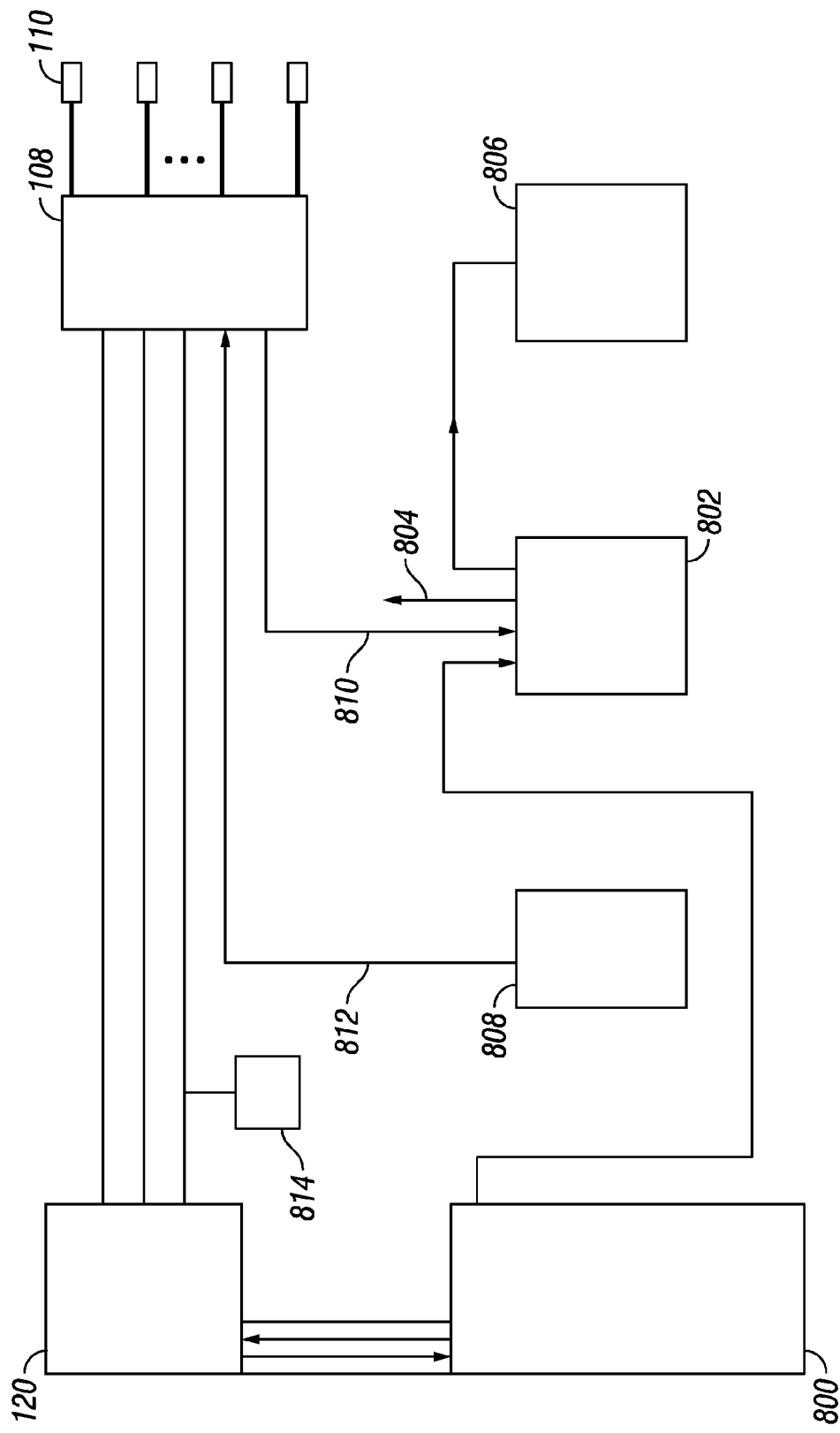
FIG. 8 is a diagram of an embodiment of the clean/purge system.

As shown in FIG. 1, a plurality of electronic devices 100 is shown. In a preferred embodiment, the electronic devices are servers, but those skilled in the art will recognize that any electronic devices, modules, or assemblies are considered to be within the scope of the invention. Each electronic device 100 is cooled in part by a circulation of coolant that enters the electronic device 100 via an electronic device supply line and leaves the electronic device 100 via an electronic device return line contained within the quick connector 106. The quick connector 106 is connected to the breaker box 108 via a connector line 110. The breaker box 108 is also connected to a supply line 112, a return line 114, a clean/purge line 116, and a data/power line 118. The supply line 112, return line 114, and data/power line 118 are directly connected to a coolant pumper module 120. The clean/purge line 116 is also indirectly connected to the coolant pumper module 120, but a few components shown in greater detail in FIG. 8 provide greater detail about the clean/purge system.

Those skilled in the art recognize that it is envisioned that a plurality of electronic devices 100 may be connected by a plurality of corresponding quick connectors 106 via a plurality of breaker boxes 108 and via at least one coolant pumper module 120. This arrangement allows for the cooling of racks 102 of electronic devices 100. The quick connector 106 further enables this arrangement to be simpler with less bulky connections.

Figure 2:
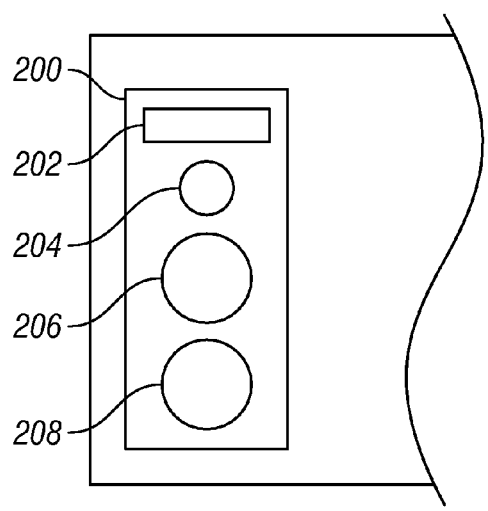
FIG. 2 is a close up diagram of an embodiment of the electronic device receptacle.

Turning to FIG. 2, each electronic device 100 has a receptacle 200 as shown. The receptacle 200 as shown includes a wireless identifier 202, preferably a radio frequency identification ("RFID") identifier, an interlocking pin 204, an electronic device supply line receiver 206, and an electronic device return line receiver 208. Those skilled in the art recognize that RFID is a preferred embodiment and an active transmitter with communications from the server, or could be other passive ID, such as barcode or matrix bar code, or similar identification. These elements will interact with the quick connector 106 shown in greater detail in FIG. 3.

Figure 3:
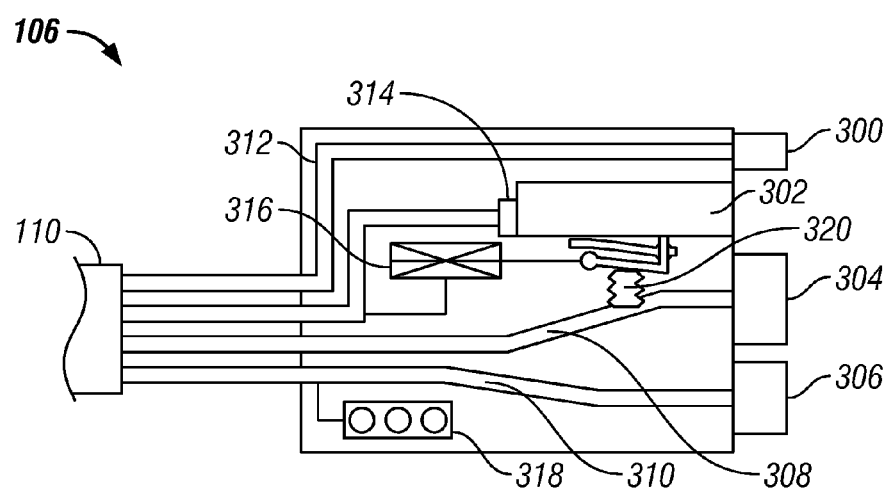
FIG. 3 is a cross sectional side view of an embodiment of the quick connector.

The quick connector 106 is shown in greater detail in FIG. 3. The quick connector 106 has a data reader 300, a connection interlock 302, an electronic device supply line coupling 304, an electronic device return line coupling 306. The data reader 300 is capable of reading the wireless identifier 202. It is preferred that the data reader 300 is capable of reading the wireless identifier 202 before, during, or after quick connector 106 is engaged with the receptacle 200. Similarly, the interlock pin 204 is enclosed within the connection interlock 302 when the quick connector 106 is engaged with the receptacle 200. Those skilled in the art will recognize that the interlock pin 204 is but one embodiment capable of affecting the connection and that variations of this element are considered to be within the scope of the invention. The interlock pin 204 may disallow a connection if there is some incompatibility, such as capacity, connector style, unit identification issues, or similar incompatibility and disallow a disconnection if the lines are charged with refrigerant. The electronic device supply line coupling 304 and the electronic device return line coupling 306 interface with the electronic device supply line receiver 206 and the electronic device return line receiver 208, respectively, when the quick connector 106 is engaged with the receptacle 200.

The electronic device supply line coupling 304 is connected to a connector supply line 308, which passes through the quick connector 106 into the connector line 110. Similarly, the electronic device return line coupling 306 is connected to a connector return line 310, which passes through the quick connector 106 into the connector line 110. A connector data line 312 is connected to the data reader 300 and passes through the quick connector 106 into the connector line 110 also. In an alternative embodiment, data reader 300 may be an interface for at least one signal from the server, with the actual reader located at the breaker box or at the pumper or at some master control.

The connector line 110 also contains a power line, which is connected to several additional components within the quick connector, in addition to the connector data line 312. The additional components include an interlock confirm 314, an interlock engager/disengager 316, and status lights 318. Those skilled in the art will recognize that the interlock engager/disengager 316 may be electronic, pneumatic, hydraulic, magnetic, mechanical, or any similar means.

A pneumatic effect ensures the pneumatic interlock 320 can not be released if the lines contain pressurized fluid or is otherwise regulated by the interlock engager/disengager 316. Thus, the connector 106 cannot be connected or disconnected if the lines are pressurized or if the connection/disconnection is not permitted as controlled by software or hardware logic controlling the action of the interlock engager/disengager 316. In operation, the full insertion of the interlock pin 204 into the connection interlock 302 will trigger the interlock confirm 314. This action may be coupled with visual indications from the status lights 318, wherein a color or display pattern or sequence may allow the user to determine the connection status of the quick connector 106.

If the electronic device flow rate or other connector characteristics are correct, an electro-mechanical solenoid lock or similar device is disengaged to allow connection. The RFID information is sent to the coolant pumper module 120 and the breaker box 108 for further processing. Electrical and/or mechanical interlocks are maintained until it is safe to disconnect the quick connector.

Figure 4:
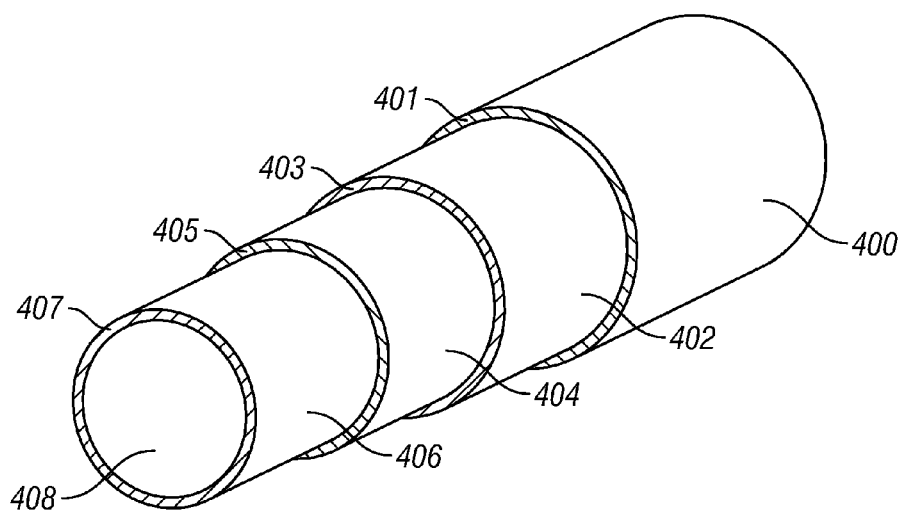
FIG. 4 is a perspective cut away view of an embodiment of a line.
Figure 5:
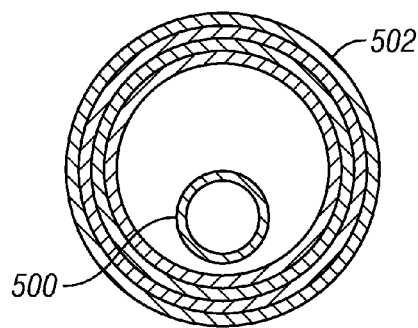
FIG. 5 is a cross sectional longitudinal view of an embodiment of the supply line and the return line.
Figure 6:
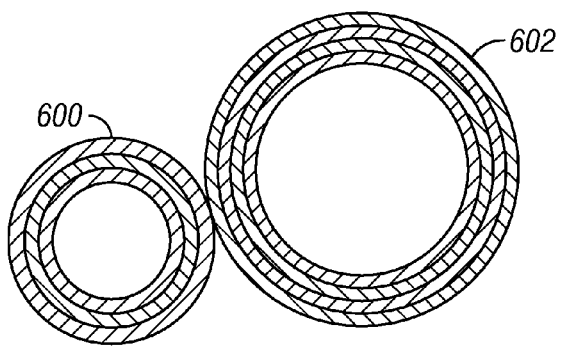
FIG. 6 is a cross sectional longitudinal view of an embodiment of the supply line and the return line.

Examples of the lines that may be used for the supply or return lines are shown in greater detail in FIGS. 4-6. The metallization layers 400, 402, 404, 406, and 408 alternate with polymer base construction layers 401, 403, 405, and 407 in the connector line 110 are shown in FIG. 4. Typically, a polymer is too porous with respect to coolant and moisture, although it has the sufficient inherent strength and flexibility for use as a coolant line. The porous nature of the polymer layers is affected by adding a coating of metallization film by vacuum vapor deposition or similar techniques. The metal film seals the polymer's pores, as well as adding hoop strength to the tubing. A composite of alternating concentric layers of polymer and metal film as shown in FIG. 4 will reduce the porosity of the tubing while retaining the flexibility of the tubing. Those skilled in the art will recognize that this technique may be applied to any of the lines in the present invention. It is envisioned that the co-extrusion of polymer and metal tubing and/or building the tubing with discrete layers where at least one metal or metallized layer is used for porosity and moisture permeation prevention and polymer or other layers are used for strength is considered to be within the scope of the invention.

FIGS. 5 and 6 show two different configurations of the connection line 110. In FIG. 5, the supply line 500 is located within the return line 502. FIG. 5 allows the metallization layer to be omitted for the supply line, because any small porosity will allow leakage from the supply line only into the return line, which is then collected with ordinary flow in the return line. Further, it allows the supply line to be thinner and more flexible, because the supply line only then has to support the difference in pressure between the supply and return lines, rather than from the supply to ambient pressure, which may be significantly greater. In FIG. 6, the supply line 600 is adjacent to the return line 602.

Figure 7:
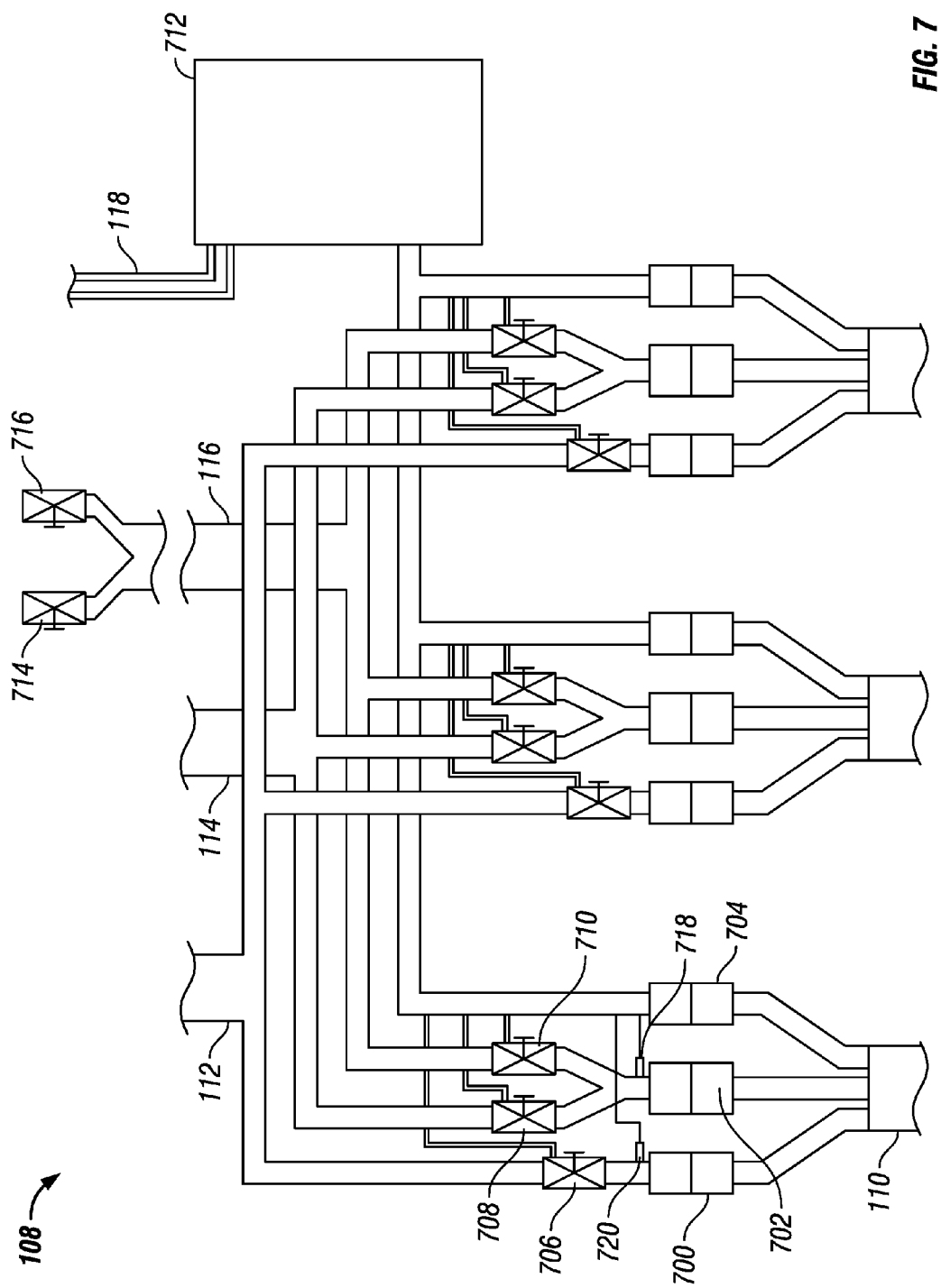
FIG. 7 is a diagram of an embodiment of the breaker box.

Turning to FIG. 7, the breaker box 108 is shown in greater detail. Each connector line 110 is connected to the breaker box 108 as shown. Additionally, the supply line 112, the return line 114, the clean/purge line 116, and the data/power line 118 are connected to the breaker box 108. At the breaker box 108, each of these lines may be connected with standard connectors 700, 702, and 704 as shown for the leftmost connector line 110. Those skilled in the art will recognize that a plurality of connector lines, such as the two additional connector lines shown in the Figure, may be included within each breaker box.

Additionally, solenoid valves 706, 708, and 710 or standard non-spill quick disconnects may be installed on these lines as shown. Ordinarily, the connection of the lines to the breaker box 108 remains in place and is connected before the electronic device 100 is connected.

The breaker box 108 is akin to an electrical breaker box with breakers. In this embodiment, the breaker box 108 contains preferably electronically controlled valves that prevent coolant from flowing to the electronic device 100 until the lines have been properly prepared. When a connection is made to the electronic device 100, the data line/power lines 118 provides a signal to the control computer or a relay communication device 712 at the breaker box 108 that a valid connection has been made. There may also be additional sensors 718 and 720 located between the components 700, 702, 706, 708, and/or 710 to allow confirmation of the connections, which are in turn connected to the control computer or a relay communication device 712.

The filtration/purification system 800 shown in FIG. 8 is responsible for continuous filtering of moisture from the coolant supply, as well as removal of non-condensable gases, and any particulates. As shown, the coolant pumper module 120 is connected to the filtration/purification system 800. The non-condensable gases are removed from the filter system by a vacuum system 802 connected to the filtration/purification system 800 and also connected to the breaker box 108. Depending on the residual coolant level and/or local or global regulations concerning the coolant considered, the vacuum either purges the residual gas to the atmosphere via a vent 804 or is pumped to a purge/storage tank 806 that is periodically emptied/changed with its contents disposed of according to local regulations. The filtration/purification system 800 works by membrane separation, pressure-swing or temperature-swing adsorption/desorption processes, or similar methods. Those skilled in the art recognize that any method of filtration/purification is considered to be within the scope of the invention. Additionally, variation in this system is within the scope of the invention. For example, this system 800 may be affected by how well the vacuum 802 is able to operate. Moreover, the amount of residual moisture/gas that is left in the lines may affect the system 800. Other factors that may affect the usage of the system 800 include how often connections/disconnections are made and how much residual contaminant the coolant pumper module can tolerate without issue.

The vacuum system 802 coordinates to purge the lines during connections/disconnections. Ordinarily, it might maintain a reservoir under partial vacuum, so that new connections/disconnections can be purged quickly without waiting for a vacuum to be drawn through a lot of tubing, or it may provide a vacuum on demand. Microprocessor controls may be used to purge nitrogen to the atmosphere and coolant to the purge/storage tank.

The nitrogen system 808 or any other inert gas as appropriately selected serves to dry and pressure test any added lines after connection, and to fill any lines to atmospheric pressure before disconnection. In a preferred embodiment, newly added lines may be tested and existing connections may be left undisturbed. The software monitoring and control system 814 oversees the operation of system components to ensure they work together and that no faults of one system cause a failure in other parts of the system.

In operation, the present invention is used for one embodiment of the connection as follows:

1. The lines are first pressurized with nitrogen supply 808 to ensure the lines are sealed and that any moisture is dried or pulled out into the nitrogen stream.
2. The line is evacuated.
3. The return line 114 via interlock valve 708 is opened to begin pressurizing the return line 114.
4. The supply line 112 via interlock valve 706 is opened to begin feeding the supply line 112.

Controls 712 in the breaker box 108 control the sequence of interlock valves 706, 708, and 710 to ensure that no coolant is introduced unless the connection to the electronic device 100 is complete. The breaker box 108 is also responsible for coordinating disconnection. When a signal to disconnect is detected by the system, which originates from the electronic device 100 or the quick connector 106, or a master controller in or connected to the pumper 120, the following sequence may occur:

1. The supply line 112 via interlock valve 706 is closed and the return line 114 via interlock valve 708 is opened to draw some or all coolant from the system.
2. The return line 114 via interlock valve 708 is closed and the clean/purge line 116 via interlock valve 710 and the vacuum line 810 via interlock 714 is opened for the vacuum system 802 to remove any remaining coolant to purge the storage tank 806.
3. The vacuum line 810 is closed via interlock valve 714 and interlock valve 716 is opened to allow the nitrogen system 808 to charge the lines to atmospheric pressure.
4. The nitrogen system 808 is closed via interlock valves 710 and 716 and a signal is given to the quick connector 106 to release the interlock 316. When the connector supply line 304 has no positive pressure relative to atmosphere, the interlock 320 releases. Both interlocks 316 and 320 must have released to allow the connector to release.

When the user connects and disconnects the lines to the electronic device 100, the lines do not contain coolant and are not under pressure. From the user's perspective, this greatly simplifies the process compared to charged lines. The lines do not need particularly specialized connectors at the breaker box 108, and thus the lines could be simply sized to length in the field.

The coolant pumper module 120 benefits from having a supply and return coolant path to the filtration/purification system 800. The coolant pumper module 120 also receives communication data from the breaker box 108 and/or the quick connector 106 to monitor total system load, or other dynamic data that can be relayed from the electronic devices 100 to the coolant pumper module 120 that can assist overall operation and performance, such as sudden increases or decreases in power consumed at the electronic device 100. The coolant pumper module 120 may prohibit additional quick connector 106 connections if the total system capacity would be exceeded. The coolant pumper module 120 would prohibit a quick connector 106 disconnection if the electronic device 100 was still live, or would be damaged by the loss of cooling for a period of time.

The communication between the quick connector 106 and the breaker box 108 relates to the load and the coolant pumper module 120 or other coolant distribution unit that cools the electronic devices 100. In a preferred embodiment, the communication is among the pumper module or some monitor/control to the pumper module, the breaker box, the quick connector, and the electronic devices, as well as the clean/purge system. The communication may be two-way and use any of the communication connection options discussed herein or known to those skilled in the art. The communication may preferably include communication in fault situations from the coolant pumper module 120 to the electronic device 100 so that the electronic devices 100 may take action accordingly. For example, if the coolant pumper module 120 fails and coolant cannot be circulated, this information would be communicated to the electronic devices 100 so that the electronic devices 100 may decrease their cooling demand, either by reducing power, temporarily suspending operation, or by shutting down, so that the loss of cooling will not cause damage to the electronic device 100 from overheating. Similarly, notices would be communicated if cooling capacity is reduced by some fault or condition, and not entirely eliminated, such as a partial loss of cooling to the coolant pumper module 120 by its chilled water/chiller heat rejection modules. Additionally, notices would be given if actual demand were exceeding expected demand beyond the system nominal capacity.

Furthermore, in a preferred embodiment, the communication to the electronic devices 100 may include information about the thermal limitations of the coolant pumper module 120, such as the speed of response to varying load conditions, active load control capability, such as regulation of the amount of coolant circulated to the electronic devices 100, or a passive load control capability, such as a fixed orifice or other fixed flow regulating device, or other pertinent information. In this way, the electronic devices 100 may alter their dynamic variations of cooling power required, either in magnitude or rate of change of the load, to suit the coolant pumper module 120 and/or any other restrictions imposed due to the other electronic devices 100 connected to the system at any given time, and their thermal demands and operational requirements.

The two-way communication allows a coordinated control of all thermal loads, including the interaction between coolant pumper module 120 and the electronic devices 100, and one or more electronic device 100 with each other, including situations of fault in any of the units, such as the electronic devices 100 or the coolant pumper module 120, within the connected system. Further, the communication allows thermal load balancing or shifting by coordinating the workloads performed by each of the electronic devices 100, so that the system may operate at some determined optimal operating point, thus reducing the combined system power requirements for the cooling system of the pumper 120 and the electronic devices 100.

Figure 9:
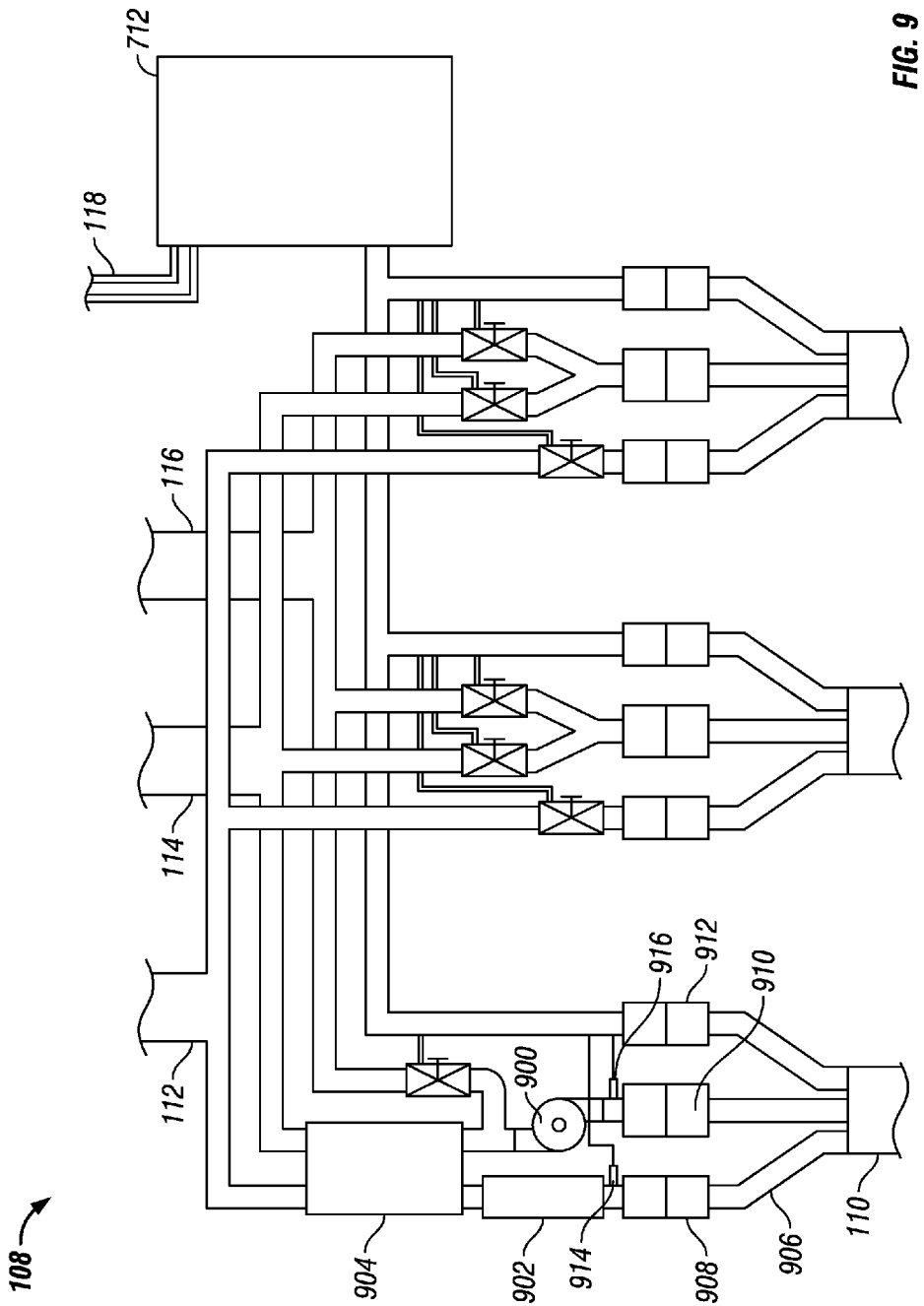
FIG. 9 is a diagram of an embodiment of the breaker box.

The breaker box 108 described herein is effective in aiding the distribution of a variety of coolants, including refrigerants as described above, but also water cooling. In the embodiment shown in FIG. 9, water is moved from the breaker box 108 to each individual electronic device 100 by the pump 900, which pumps water in this embodiment. In a preferred embodiment, the pump 900 may be located within the breaker box 108, as shown. The breaker box 108 may also contain at least one water reservoir 902 and at least one heat exchanger 904 in thermal communication with the supply line 112/return line 114 and a water line 906. In a preferred embodiment, it is envisioned that a plurality of water pumps with a corresponding plurality of water reservoirs may accommodate each electronic device connected to the system. Additionally, multiple breaker boxes 108 may be connected to each electronic device 100 to offer redundancy in the event that a pump 900 fails or becomes inoperative. The breaker box may also have a single pump manifolded to feed all connectors or may have a single reservoir manifolded to all connectors, or some combination of distinct and shared pumps and reservoirs.

In this embodiment, the breaker box 108 may have either conventional water solenoid valves 908, 910, and 912 or standard non-spill quick disconnects may be installed on these lines as shown or the novel connector described herein. In another embodiment, the breaker box 108 may even be fixed connected to the supply 112 and return 114 lines. The water lines 906 to and from the electronic device are preferably equipped with either no-spill water quick connects or the novel connectors described herein. There may also be additional sensors 914 and 916 located between the components 900, 908, 910, 912, and/or 914 to allow confirmation of the connections, which are in turn connected to the control computer or a relay communication device 712.

In use, the water line continues inside the electronic device 100, supplying cold water to a heat exchanger, cold plate, heat sink, or similar device that removes heat from the component or components within the electronic device. The warm water is returned to the edge of the electronic device then through the water connector and back to the breaker box 108. The heat is then rejected into the coolant supplied by the coolant pumper module 120 through the heat exchanger inside the breaker box 108.

The present invention offers the flexibility of using liquid coolants in conjunction with electronics, namely the server's components. Though a variety of coolants may be used herein with the breaker box discussed herein, water and refrigerant are preferred embodiments. With respect to the quick connector, the use of the quick connector with respect to refrigerants is preferred. Though a variety of refrigerants known to those skilled in the art may be used, the use of R134 and carbon dioxide as the refrigerant are considered to be within the scope of the invention and preferred. These refrigerants offer the additional advantage of vaporizing at atmospheric pressure.

The invention has been described in the context of preferred and other embodiments and not every embodiment of the invention has been described. Obvious modifications and alterations to the described embodiments are available to those of ordinary skill in the art. The disclosed and undisclosed embodiments are not intended to limit or restrict the scope or applicability of the invention conceived of by the Applicants, but rather, in conformity with the patent laws, Applicants intend to protect all such modifications and improvements to the full extent that such falls within the scope or range of equivalent of the following claims.

What is claimed is:

1. A system for cooling at least one electronic device with a liquid coolant, wherein each electronic device has a wireless identifier, the system, comprising:
   a coolant pumper module;
   a breaker box;
   a coolant supply line connecting the pumper module and the breaker box;
   a coolant return line connecting the pumper module and the breaker box;
   a clean or purge line associated with the breaker box;
   a coolant connector line connected to the breaker box and having a quick connector for connection to the electronic device, the quick connector comprising a data reader capable of reading the wireless identifier; and
   a software monitoring and cooling system control system.

2. The system of claim 1 further comprising a filtration/purification module in connection with the pumper module and the breaker box.

3. The system of claim 1 wherein the quick connector further comprises:
   a connection interlock; and
   an electronic interlock engager/disengager.

4. The system of claim 1 wherein the quick connector further comprises status indicators.

5. The system of claim 1 wherein the quick connector further comprises an interlock.

6. The system of claim 1 wherein the connector line comprises at least one metallic layer and at least one polymer layer.

7. The system of claim 1 wherein the wireless identifier is a radio frequency identification identifier.

8. The system of claim 1 wherein the liquid coolant is a refrigerant.

9. The system of claim 1 wherein the breaker box further comprises a pump and a reservoir.

10. A method of disconnecting at least one electronic device from a cooling system, comprising:
    providing a liquid cooling system having a breaker box distribution module;
    providing a coolant supply line, a coolant return line, and a vacuum line from the cooling system to the electronic device, the coolant supply line and a coolant return line having a quick connector for connection with a receptacle associated with the electronic device;
    closing the coolant supply line;
    opening the return line to draw a coolant from the cooling system;
    closing the return line;
    opening the vacuum line to remove coolant;
    closing the vacuum line; and
    charging the supply and return line lines to atmospheric pressure.

11. A system for cooling at least one electronic device with a liquid coolant, comprising:
    a coolant pump module;
    a supply line, a return line; and a purge line connecting a breaker box to the coolant pump module;
    a connector line connecting the breaker box to a quick connector;
    the quick connector connecting to the electronic device, wherein the quick connector is adapted to ensure that no coolant or an improper pressure is introduced unless the connection to the electronic device is complete; and
    a software monitoring and cooling system control system;
    wherein each electronic device has a wireless identifier.

* * * * *